US007315084B2

United States Patent
Fujii

(10) Patent No.: US 7,315,084 B2
(45) Date of Patent: Jan. 1, 2008

(54) COPPER INTERCONNECTION AND THE METHOD FOR FABRICATING THE SAME

(75) Inventor: Akiko Fujii, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 106 days.

(21) Appl. No.: 11/183,730

(22) Filed: Jul. 18, 2005

(65) Prior Publication Data

US 2005/0250328 A1 Nov. 10, 2005

Related U.S. Application Data

(62) Division of application No. 10/329,219, filed on Dec. 24, 2002, now abandoned.

(30) Foreign Application Priority Data

Dec. 25, 2001 (JP) ............... 2001-392399

(51) Int. Cl.
*H01L 23/495* (2006.01)

(52) U.S. Cl. ............... 257/762; 257/774; 257/E21.575; 438/687; 438/E21.584; 438/E21.585

(58) Field of Classification Search ............... 257/774, 257/762; 438/667, 672, 675, 687
See application file for complete search history.

(56) References Cited

U.S. PATENT DOCUMENTS

| 5,801,444 | A | 9/1998 | Aboelfotoh et al. |
| 6,492,266 | B1 * | 12/2002 | Ngo et al. ............... 438/687 |
| 6,498,098 | B1 | 12/2002 | Abe |
| 6,613,686 | B2 | 9/2003 | Nishizawa |
| 6,703,307 | B2 | 3/2004 | Lopatin et al. |
| 6,703,308 | B1 | 3/2004 | Besser et al. |
| 2002/0001944 | A1 | 1/2002 | Faust et al. |
| 2002/0009880 | A1 | 1/2002 | Jiang et al. |

FOREIGN PATENT DOCUMENTS

| JP | 01-248538 | 10/1989 |
| JP | HEI 08-107110 | 4/1996 |
| JP | 09-20942 | 1/1997 |

(Continued)

OTHER PUBLICATIONS

Dirks A.G. et al., "Al-Ti-Si Thin Alloy Films", Journal of Applied Physics 59(6):2010-1014 (1986).

*Primary Examiner*—Quoc Hoang
(74) *Attorney, Agent, or Firm*—Scully, Scott, Murphy & Presser, P.C.

(57) ABSTRACT

A copper interconnection where holes in the vicinity of an interface are reduced to lower contribution of interface diffusion to Cu the EM, increase a lifetime, and simultaneously increase adhesiveness and resistance to stress migration is constituted in a manner that impurities 15 form a solid solution in the vicinity of an interface between a Cu layer 16 and a barrier metal layer 12, the impurities are precipitated, and an amorphous Cu layer 14 is fabricated, or a compound with Cu is fabricated. The copper interconnection is also constituted in a manner that impurities 15 form a solid solution in the vicinity of an interface between the Cu layer 16 and a cap layer 19, the impurities 15 are precipitated, and an amorphous Cu layer 14 is fabricated, or a compound with Cu is fabricated.

1 Claim, 9 Drawing Sheets

FOREIGN PATENT DOCUMENTS

| | | |
|---|---|---|
| JP | 11-045887 | 2/1999 |
| JP | 11-297696 | 10/1999 |
| JP | 11-330001 | 11/1999 |
| JP | 11-340229 | 12/1999 |
| JP | 2000-174027 | 6/2000 |

* cited by examiner

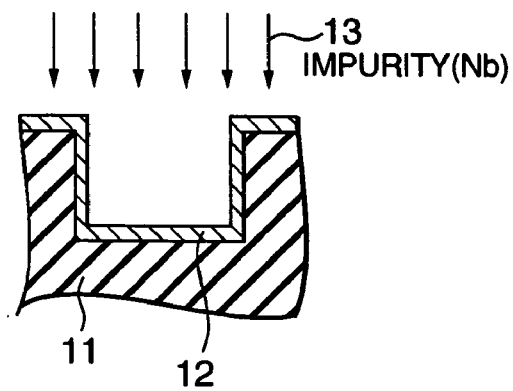
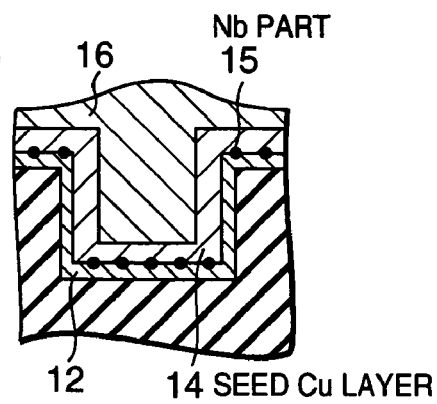
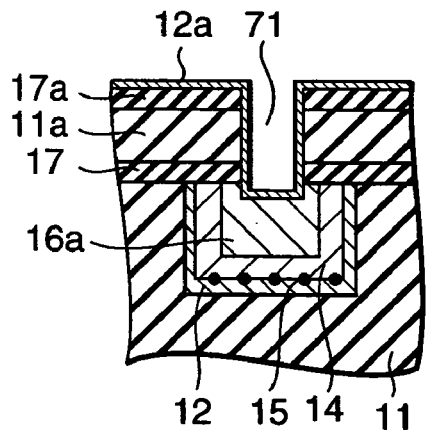
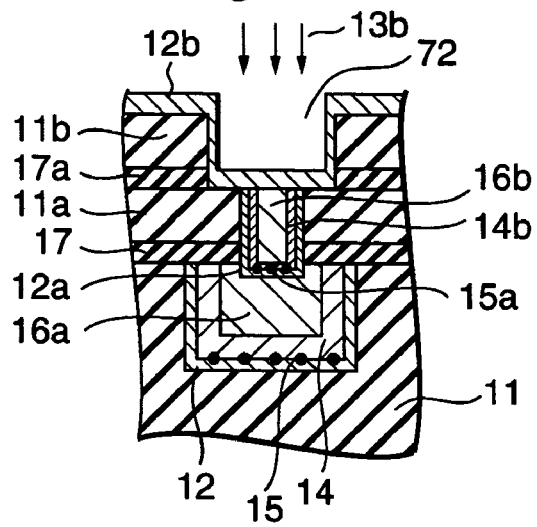
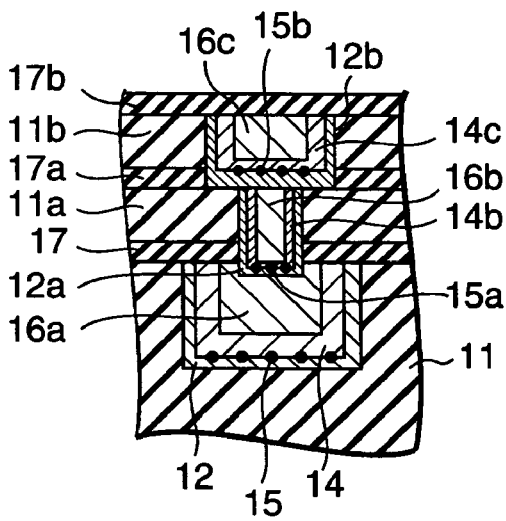

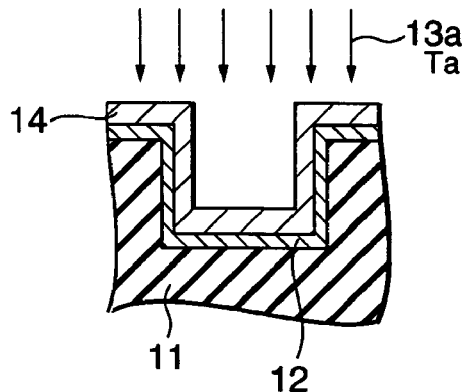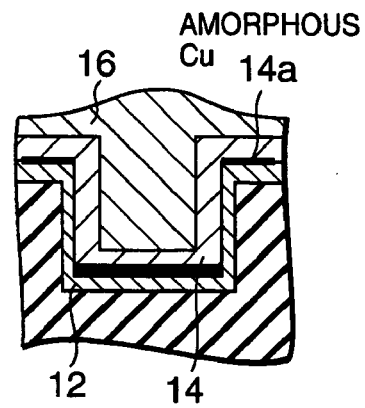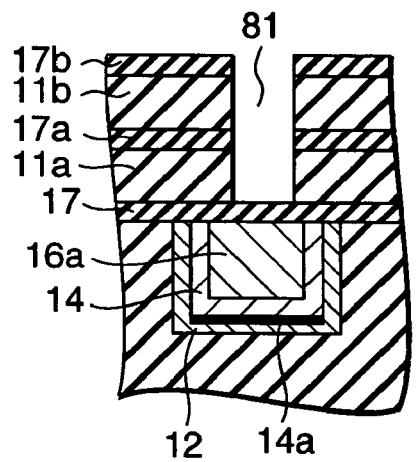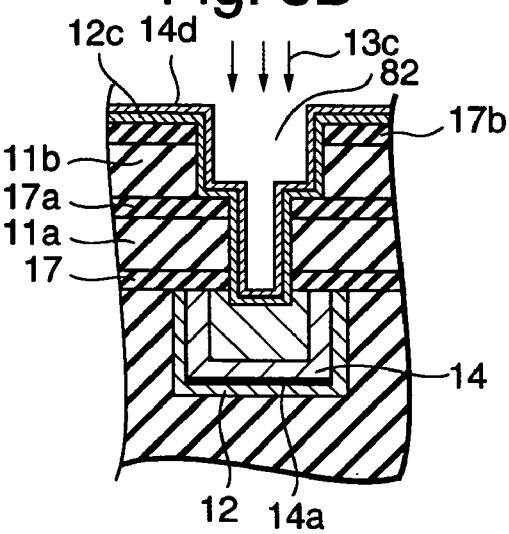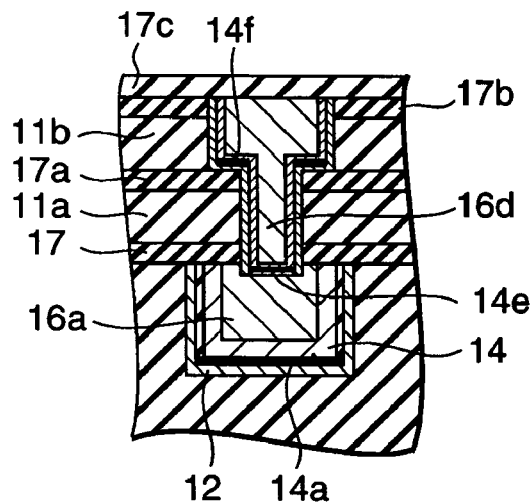

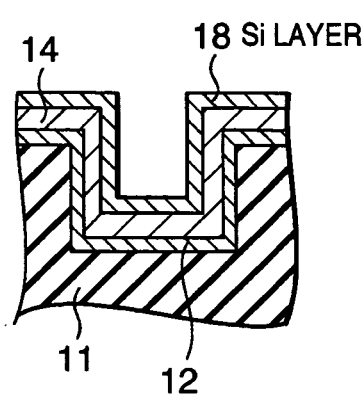
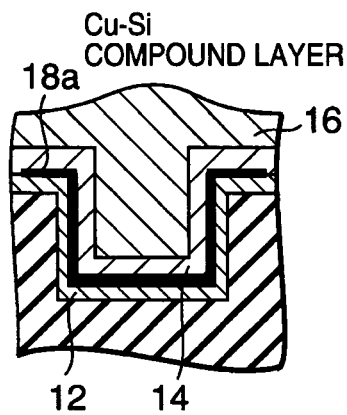
Fig. 9A    Fig. 9B
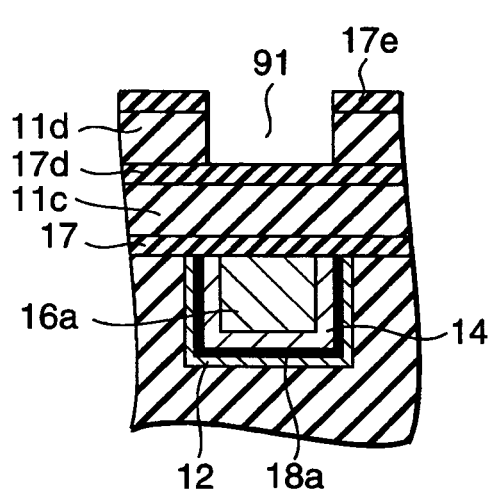
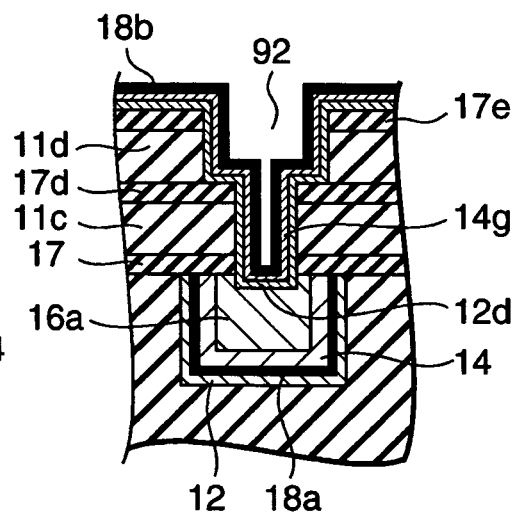
Fig. 9C    Fig. 9D
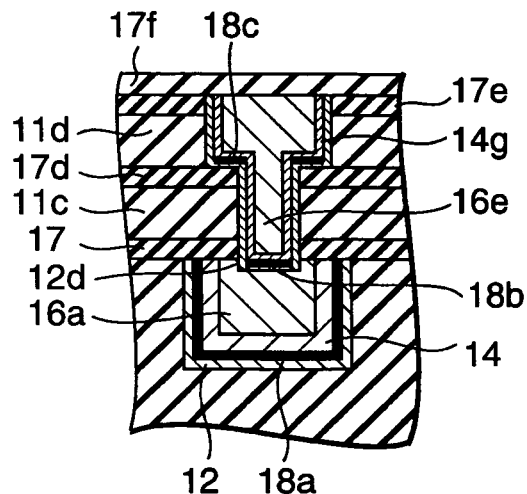
Fig. 9E

COPPER INTERCONNECTION AND THE METHOD FOR FABRICATING THE SAME

CROSS REFERENCE TO RELATED APPLICATION

The present application is a divisional of U.S. patent application Ser. No. 10/329,219, filed on Dec. 24, 2002 now abandoned.

BACKGROUND OF THE INVENTION

1. Field of the Invention

The present invention relates to a copper interconnection structure and its fabrication method and, more particularly, to a copper interconnection structure of a increasing Cu interconnection lifetime, and its fabrication method.

2. Description of the Prior Art

It is well known that in recent years efforts have been made to achieve high performance and functionality of a semiconductor integrated circuit used for an information electronic equipment such as a cell phone.

Such a semiconductor integrated circuit has many circuit elements, for example transistors. It is also a well-known fact that such a semiconductor integrated circuit is fabricated by using a high-precision semiconductor fabrication process. Further, in the high-precision semiconductor fabrication process, an interconnection structure of an increased interconnection lifetime, especially a copper interconnection structure attracts attention.

FIGS. 1A to 1D are sectional views of a copper interconnection illustrating a conventional copper interconnection fabrication process. Referring to FIGS. 1A to 1D, the conventional copper interconnection structure is provided with a barrier metal (Ta) layer 12 made of mainly high melting point metal such as Ta on an insulating layer 11, a thin seed Cu layer 14 fabricated by sputtering, a Cu interconnection layer 16a fabricated using a method such as electro-plating to thickly deposit Cu, and an SiN layer 17 fabricated by using sputtering to deposit SiN or the like.

Next, a conventional copper interconnection fabrication method will be described by referring to the sectional views of FIGS. 1A to 1D again.

First, according to the conventional copper interconnection fabrication process, as shown in FIG. 1A, a Cu interconnection groove 10 is fabricated on the insulating layer 11, then the barrier metal (Ta) layer 12 mainly made of high melting point metal such as Ta is fabricated thin by sputtering and, further as shown in FIG. 1B, seed Cu is thinly sputtered to fabricate the seed Cu layer 14. Subsequently, Cu is thickly deposited by a method such as electro-plating to fabricate the Cu layer 16. This is subjected to heat treatment at about 400° C. for 10 min. to several hours according to an interconnection thickness and/or an interconnection width to grow Cu grains, and uniformly fill the groove. Subsequently, as shown in FIG. 1C, the layer is made flat by the chemical mechanical polishing (CMP) method or the like to fabricate an interconnection 16a. A surface of the interconnection 16a is treated such as cleaning and/or plasma irradiation to remove a Cu natural oxide layer and, then, as shown in FIG. 1D, an insulating film, such as SiN or the like, is deposited by sputtering to fabricate the SiN layer 17.

As an example of an electromigration (EM) suppression in an Al interconnection, there is an example of adding a small amount of impurities such as Cu to Al as described in Japanese Patent Application Laid-Open No. Hei 08 (1996)-107110 (paragraphs 0015 to 0020, FIG. 1).

Such impurities are added because as described in "Al—Ti and Al—Ti—Si thin alloy films", Albertus G. Dirks, Tien Tien, and Janet M. Towner, pp. 2010, "Journal of Applied Physics", vol. 59-6 (1968), impurities are precipitated on a grain boundary to lower a hole density, whereby contribution of grain boundary diffusion is reduced. In the Cu interconnection, an EM main diffusion path is considered to be an interface between Cu and other materials. Accordingly, interface holes must be selectively removed.

However, in such a copper interconnection fabrication method, there are problems that an EM resistance of the copper interconnection is low, and particularly, in a case of the copper interconnection width is narrow, the copper interconnection has shorter lifetime than the Al interconnection. A reason is that in the case of the Al interconnection, if an interconnection width is smaller than an average Al grain size, and a gain boundary becomes a bamboo structure, Al lattice diffusion becomes a main diffusion mechanism. This lattice diffusion is much slower than either grain boundary or interface diffusion. Thus, in the case of the narrow interconnection where grain boundary diffusion is dominant which achieves a bamboo grain boundary structure, an EM lifetime is longer than a wide interconnection.

On the other hand, in the case of the Cu interconnection, even if an interconnection width is smaller than an average Cu grain size, and a grain boundary becomes a bamboo structure, not Cu lattice diffusion but interface diffusion becomes a main diffusion mechanism. Thus, an increase in the EM lifetime observed in the case of the thin Al interconnection is not seen in the case of the Cu interconnection. As a result, in the case of an interconnection width is small, the Cu interconnection has shorter lifetime than the Al interconnection.

SUMMARY OF THE INVENTION

Objects of the present invention are to provide a copper interconnection structure which eliminates the foregoing drawbacks of the conventional art, and solves the technical problems to increase an interconnection lifetime, and its fabrication method.

A constitution of a copper interconnection structure of the present invention is characterized in that in the vicinity of an interface between Cu and barrier metal or between Cu and a cap layer, in order to selectively reduce holes existed in an interface between Cu or a Cu alloy layer and a barrier metal layer, hole reduction impurities added to Cu form a solid solution, the hole reduction impurities are precipitated, amorphous Cu is provided or a compound with Cu is formed, whereby holes in the vicinity of the interface are reduced, contribution of interface diffusion to Cu EM is reduced, a lifetime is increased, and simultaneously adhesiveness and resistance to stress migration are increased.

A constitution of a copper interconnection fabrication method of the present invention is characterized in that after sputtering of barrier metal on an interconnection groove, in order to reduce holes existed in an interface between Cu or a Cu alloy layer and a barrier metal layer, hole reduction impurities added to Cu are ion-implanted in the barrier metal, heat treatment is executed, seed Cu is sputtered, and then Cu which makes an interconnection is deposited thereon, the hole reduction impurities form a solid solution in the vicinity of the interface between Cu and the barrier metal, the hole reduction impurities are precipitated, and amorphous Cu is provided or a compound with Cu is formed.

Further, a constitution of another copper interconnection fabrication method of the present invention is characterized in that Cu or a Cu alloy is embedded in an interconnection groove fabricated in an interconnection surface, an interconnection is fabricated by using the CMP method or the like, then impurities are ion-implanted in order to reduce holes existed in an interface between Cu or a Cu alloy layer and a barrier metal layer, heat treatment is executed, a surface of the interconnection is treated such as cleaning and/or plasma irradiation to remove a Cu natural oxide layer, and then a cap layer is fabricated by sputtering to make Cu amorphous in the vicinity of an interface with the cap layer.

Furthermore, according to the present invention, in place of ion-implantation of the hole reduction impurities added to the Cu executed to selectively reduce the holes existed in the interface between the Cu or the Cu alloy layer and the barrier metal layer, and the heat treatment, the impurities can be diffused from thin layer by heat treatment in place of ion-implantation, and then diffused by heat. The step of executing the treatment such as cleaning and/or plasma irradiation on the surface of the interconnection to remove the Cu natural oxide layer can be executed after the fabrication of the interconnection, and then the hole reduction impurities can be ion-implanted. Further, the step of executing the treatment such as cleaning and/or plasma irradiation on the surface of the interconnection to remove the Cu natural oxide layer can be executed after the fabrication of the interconnection, and then the hole reduction impurities can be deposited by a very thin layer, and the hole reduction impurities can be one of Nb, Ta, Si, Ru and V.

BRIEF DESCRIPTION OF THE DRAWINGS

FIGS. 7A to 7E are sectional views of a copper interconnection illustrating a copper interconnection fabrication process according to a sixth embodiment of the present invention.

FIGS. 8A to 8E are sectional views of a copper interconnection illustrating a copper interconnection fabrication process according to a seventh embodiment of the present invention.

FIGS. 9A to 9E are sectional views of a copper interconnection illustrating a copper interconnection fabrication process according to an eight embodiment of the present invention.

DETAILED DESCRIPTION OF THE PREFERRED EMBODIMENTS

Next, detailed description will be made of a copper interconnection structure and its fabrication method according to several embodiments of the present invention with reference to the accompanying drawings.

Figure 1A:
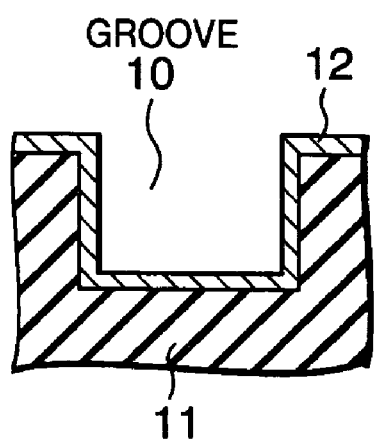
FIGS. 1A to 1D are sectional views of a copper interconnection illustrating a conventional copper interconnection fabrication process.
Figure 1B:
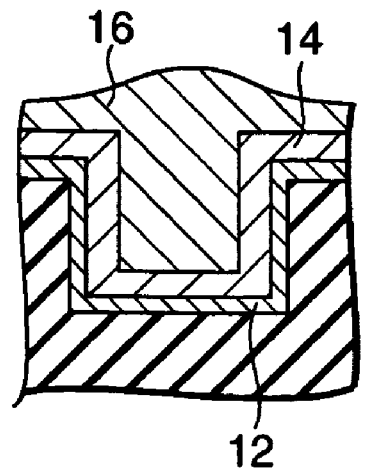
Figure 1C:
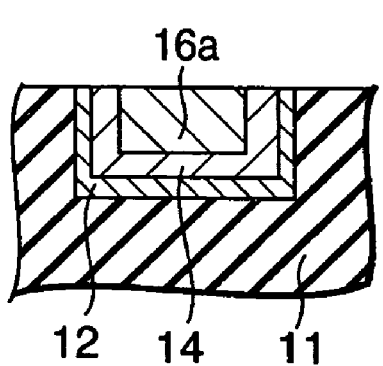
Figure 1D:
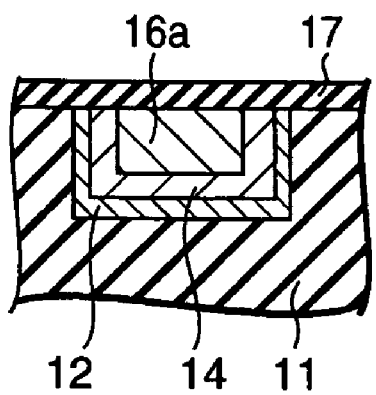
Figure 2A:
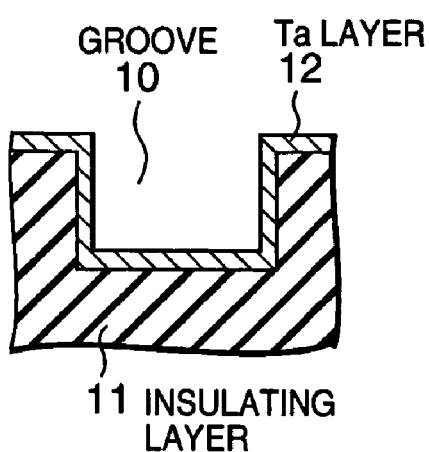
FIGS. 2A to 2E are sectional views of a copper interconnection illustrating a copper interconnection fabrication process according to a first embodiment of the present invention.
Figure 2B:
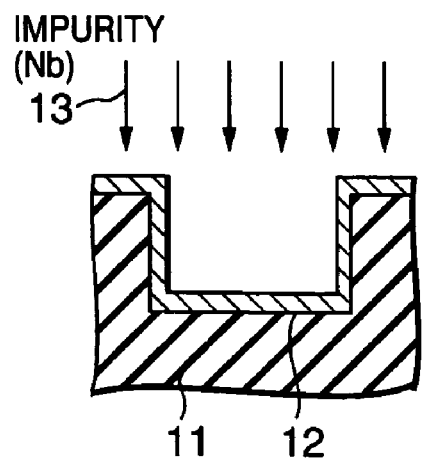

FIGS. 2A to 2E are sectional views showing a process of a fabrication method according to a first embodiment of the present invention. First, in the fabrication method of the first embodiment of the invention, as shown in FIG. 2A, after a Cu interconnection groove 10 is fabricated on an insulating layer 11, a barrier metal (Ta) layer 12 mainly made of high melting point metal such as Ta is fabricated thereon by sputtering. Subsequently, as shown in FIG. 2B, impurities 13$a$ such as Nb are injected by injection energy of 2 keV to 5 keV, and a dose amount of $1.0E14$ $cm^{-2}$, and subjected to annealing at about 900° C. for several min. Accordingly, the impurity Nb becomes a solid solution on the surface to fabricate an impurity part (Nb) 15.

Figure 2C:
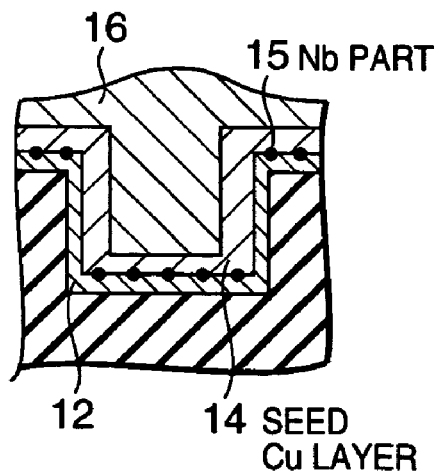
Figure 2D:
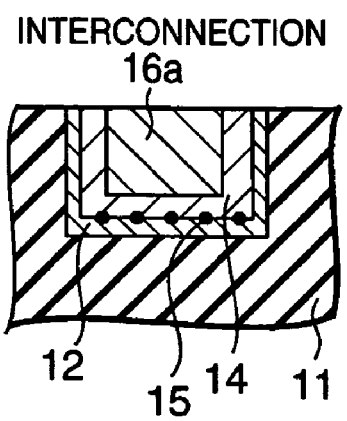
Figure 2E:
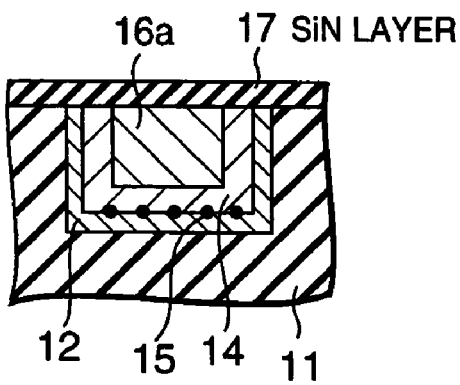

Then, as shown in FIG. 2C, seed Cu is thinly sputtered to fabricate a seed Cu layer 14, and Cu is thickly deposited subsequently by a method such as electro-plating to fabricate a Cu layer 16. The Cu layer 16 is subjected to heat treatment at about 400° C. for about 10 min. to several hours in accordance with an interconnection thickness and/or an interconnection width to grow Cu grains, and uniformly fill the groove. Subsequently, by using CMP method or the like, the layer is made flat to fabricate an interconnection 16$a$ as shown in FIG. 2D. A surface of the interconnection is treated such as cleaning and/or plasma irradiation to remove a Cu natural oxide layer and, then, as shown in FIG. 2E, SiN or the like is sputtered to fabricate an insulating layer 17.

Thus, an interconnection structure is obtained, where the impurity Nb 13 becomes a solid solution in the vicinity of an interface between the seed Cu layer 14 and the Ta barrier metal layer 12 of the interconnection layer.

On the other hand, an interconnection structure can be obtained, where an impurity Si in place of the impurity Nb 13 is precipitated in the vicinity of the interface between the seed Cu layer 14 and the Ta barrier metal layer 12 of the interconnection layer. First, as in the case of the fabrication process of the interconnection structure where the impurity Nb 13 becomes a solid solution in the vicinity of the interface between the seed Cu layer 14 and the Ta barrier metal layer 12 of the interconnection layer, a barrier metal (Ta) layer 12 is fabricated by sputtering as shown in FIG. 2A.

Subsequently, as shown in FIG. 2B, impurities such as Si are injected by injection energy of 5 keV to 10 keV, and a dose amount of $2.0E14$ $cm^{-2}$ to $5.0E14$ $cm^{-2}$, and subjected to annealing at about 850° C. for several min. Accordingly, the impurity Si is precipitated on a very surface of Ta to fabricate an impurity (Si) part 15$a$.

The process thereafter is similar to the fabrication process of the interconnection structure where the impurity Nb 13 becomes a solid solution in the vicinity of the interface between the seed Cu layer 14 and the Ta barrier metal layer 12 of the interconnection layer, that is, the steps from FIG. 2C to 2E are sequentially executed.

The embodiment has been described by way of example where the interconnection groove 10 is fabricated on the insulating layer 11. Apparently, however, the interconnection groove 10 can be fabricated on a semiconductor layer, another interconnection layer and/or a combination thereof.

Figure 3A:
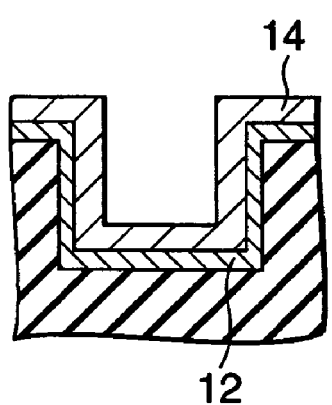
FIGS. 3A to 3E are sectional views of a copper interconnection illustrating a copper interconnection fabrication process according to a second embodiment of the present invention.
Figure 3B:
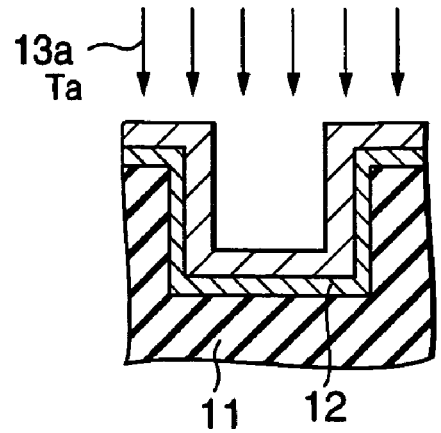
Figure 3C:
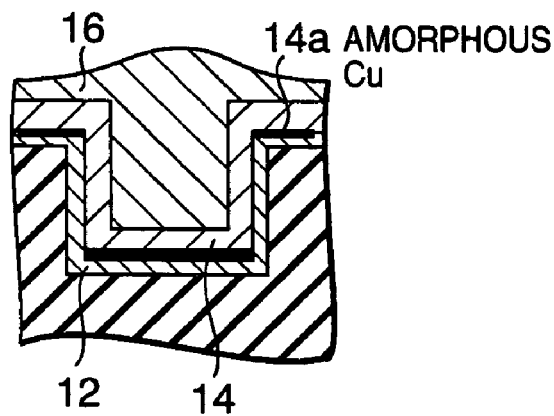

FIGS. 3A to 3E are sectional views showing a process of a fabrication method according to a second embodiment of the present invention. First, in the fabrication method of the second embodiment of the invention, as shown in FIG. 3A, after a Cu interconnection groove 10 is fabricated on an insulating layer 11, a barrier metal (Ta) layer 12 mainly made of high melting point metal such as Ta, and a seed Cu layer 14 made of seed Cu are fabricated thin by sputtering. Subsequently, as shown in FIG. 3B, impurities 13a such as Ta are injected by injection energy of 5.0 keV, and a dose amount of $1.0E15$ cm$^{-2}$, and subjected to annealing at about 900° C. for several min. Accordingly, Cu becomes amorphous in the vicinity of an interface between the seed Cu and the barrier Ta to from an amorphous Cu layer 14a. Subsequently, as shown in FIG. 3C, Cu is thickly deposited by a method such as electro-plating to fabricate a Cu layer 16. The Cu layer 16 is subjected to heat treatment at about 400° C. for about 10 min. to several hours in accordance with an interconnection thickness and/or an interconnection width to grow Cu grains, and uniformly fill the interconnection groove.

Figure 3D:
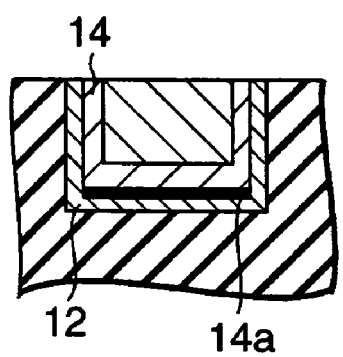
Figure 3E:
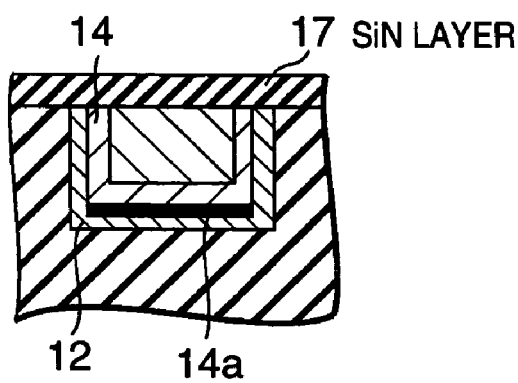

Subsequently, by using CMP method or the like, an interconnection 16a is fabricated as shown in FIG. 3D. A surface of the interconnection is treated such as cleaning and/or plasma irradiation to remove a Cu natural oxide layer and, then, as shown in FIG. 3E, SiN or the like is sputtered to fabricate an insulating layer 17. Thus, an interconnection structure is obtained, where there is an amorphous Cu layer 14a in an interface between the seed Cu layer 14 and the Ta layer 12.

Figure 4A:
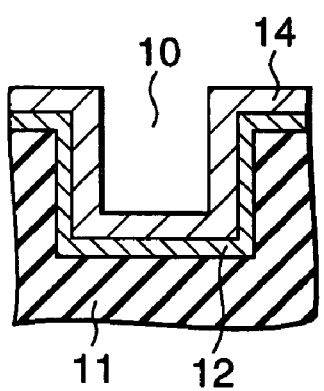
FIGS. 4A to 4E are sectional views of a copper interconnection illustrating a copper interconnection fabrication process according to a third embodiment of the present invention.
Figure 4B:
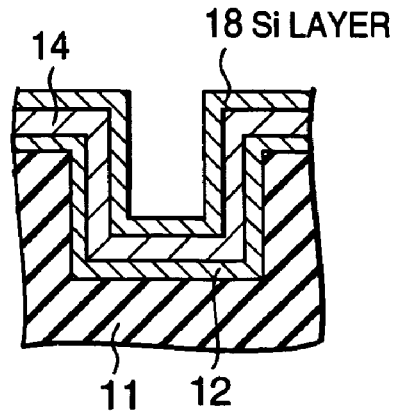
Figure 4C:
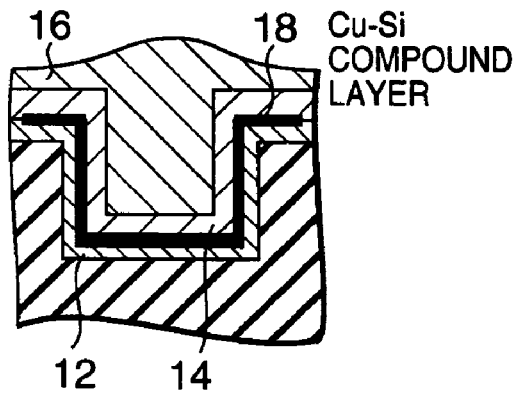

FIGS. 4A to 4E are sectional views showing a process of a fabrication method according to a third embodiment of the present invention. First, in the fabrication method of the third embodiment of the invention, as shown in FIG. 4A, after a Cu interconnection groove 10 is fabricated on an insulating layer 11, a barrier metal layer 12 mainly made of high melting point metal such as Ta, and a seed Cu layer 14 made of seed Cu are fabricated thin by sputtering. Subsequently, as shown in FIG. 4B, a solid phase Si layer 18 containing impurities such as Si is fabricated by several nm, and subjected to annealing at about 900° C. for several min., to fabricate a Cu—Si compound layer 18a in an interface between the seed Cu layer 14 and the Ta layer 12. As shown in FIG. 4C, Cu is thickly deposited by a method such as electro-plating to fabricate a Cu layer 16. The Cu layer 16 is subjected to heat treatment at about 400° C. for about 10 min. to several hours in accordance with an interconnection thickness and/or an interconnection width to grow Cu grains, and uniformly fill the groove 10.

Figure 4D:
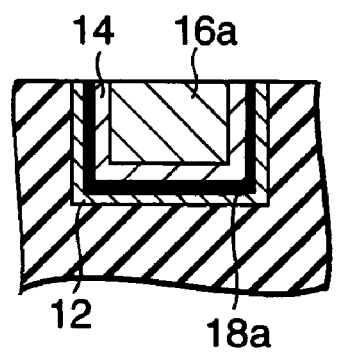
Figure 4E:
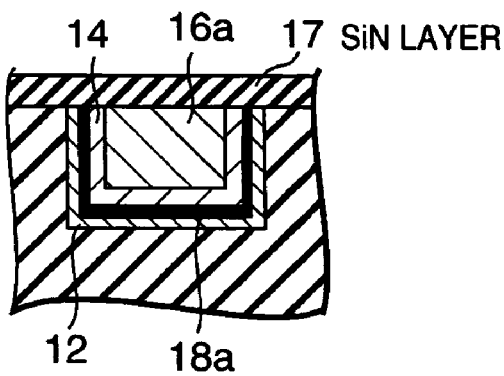

Subsequently, by using CMP method or the like, an interconnection 18a is fabricated as shown in FIG. 4D. A surface of the interconnection is treated such as cleaning and/or plasma irradiation to remove a Cu natural oxide layer and, then, as shown in FIG. 4E, SiN or the like is deposited by sputtering to fabricate an insulating layer 17. Thus, an interconnection structure is obtained, where there is a Cu—Si compound layer 18a in an interface between the seed Cu layer 14 and the barrier metal Ta layer 12.

Figure 5A:
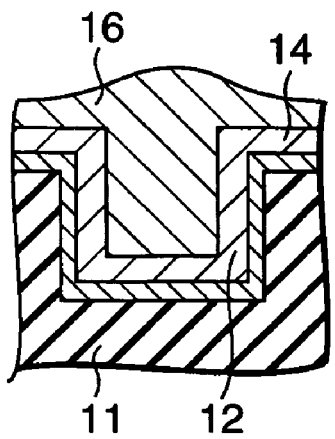
FIGS. 5A to 5F are sectional views of a copper interconnection illustrating a copper interconnection fabrication process according to a fourth embodiment of the present invention.

FIGS. 5A to 5F are sectional views showing a process of a fabrication method according to a fourth embodiment of the present invention. First, in the fabrication method of the fourth embodiment of the invention, as shown in FIG. 5A, after a Cu interconnection groove 10 is fabricated on an insulating layer 11, a barrier metal layer 12 mainly made of high melting point metal such as Ta, and a seed Cu layer 14 made of seed Cu are fabricated thin by sputtering. Subsequently, Cu is thickly deposited by a method such as electroplating to fabricate a Cu layer 16. This layer is subjected to heat treatment at about 400° C. for about 10 min. to several hours in accordance with an interconnection thickness and/or an interconnection width to grow Cu grains, and uniformly fill the groove.

Figure 5B:
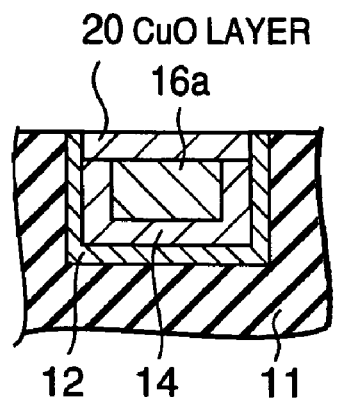
Figure 5C:
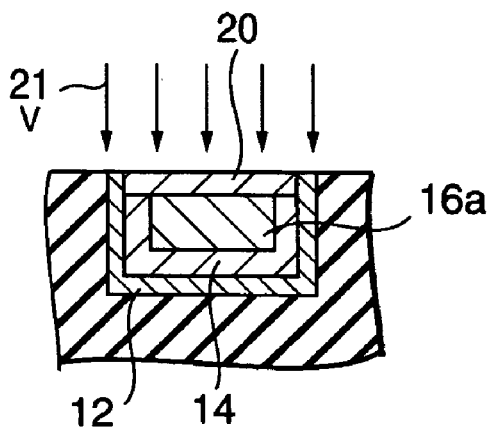
Figure 5D:
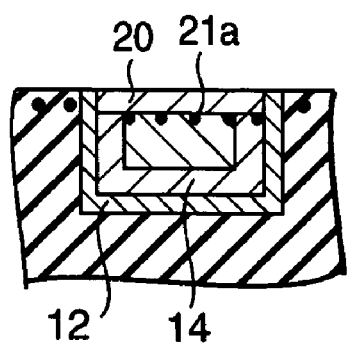
Figure 5E:
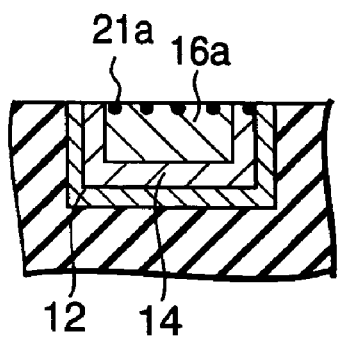
Figure 5F:
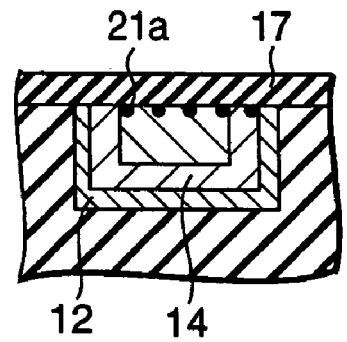

Subsequently, by using CMP method or the like, an interconnection 16a is fabricated as shown in FIG. 5B. In the drawing, a CuOx natural oxide film 20 is shown on the Cu layer 16. Here, as shown in FIG. 5C, impurities 21 such as V are injected by injection energy of 2 keV to 5 keV, and a dose amount of $1.0E14$ cm$^{-2}$, and subjected to annealing at about 900° C. for several min. The impurity V becomes a solid solution in the vicinity of an interface CuOx 20 and the interconnection Cu of the surface. As shown in FIG. 5E, a surface of the interconnection is treated such as cleaning and/or plasma irradiation to remove the Cu natural oxide layer 20 and, then, as shown in FIG. 5F, SiN or the like is deposited by sputtering. Thus, an interconnection structure is obtained, where an impurity V layer 21a becomes a solid solution in an interface between a cap SiN 17 and the Cu layer 16.

Figure 6A:
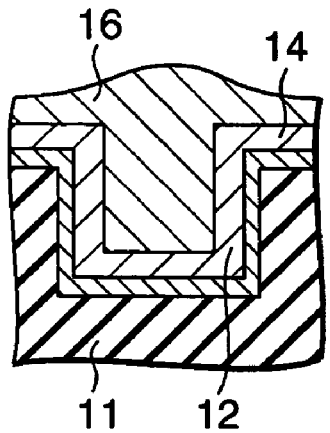
FIGS. 6A to 6F are sectional views of a copper interconnection illustrating a copper interconnection fabrication process according to a fifth embodiment of the present invention.

FIGS. 6A to 6F are sectional views showing a process of a fabrication method according to a fifth embodiment of the present invention. First, in the fabrication method of the fifth embodiment of the invention, as shown in FIG. 6A, after a Cu interconnection groove 10 is fabricated on an insulating layer 11, a barrier metal layer 12 mainly made of high melting point metal such as Ta, and a seed Cu layer 14 are fabricated thin by sputtering. Subsequently, Cu is thickly deposited by a method such as electro-plating to fabricate a Cu layer 16. This layer is subjected to heat treatment at about 400° C. for about 10 min. to several hours in accordance with an interconnection thickness and/or an interconnection width to grow Cu grains, and uniformly fill the groove. In the drawing, a CuOx natural oxide film 20 is shown on the Cu layer 16.

Figure 6B:
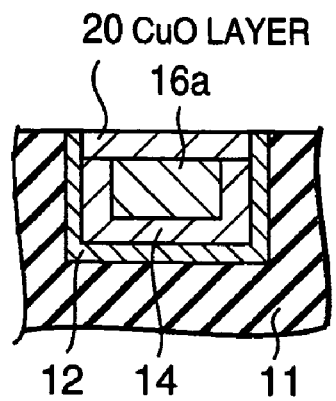
Figure 6C:
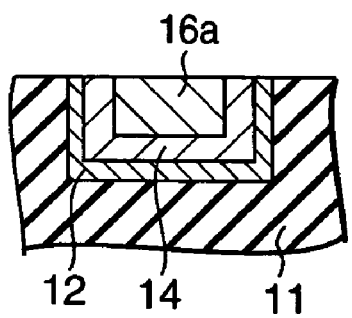
Figure 6D:
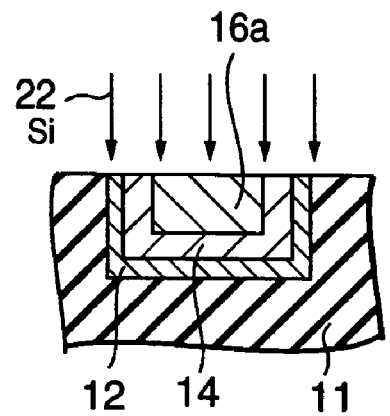
Figure 6E:
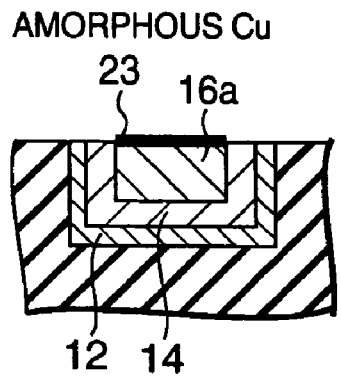
Figure 6F:
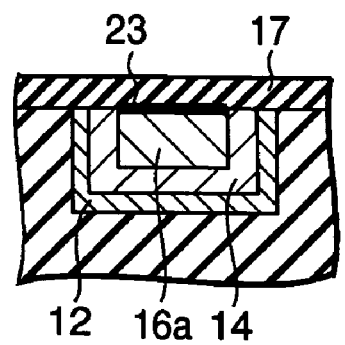

Subsequently, as shown in FIG. 6B, CMP method or the like is used to fabricate an interconnection, and a surface of the interconnection is treated such as cleaning and/or plasma irradiation to remove the Cu natural oxide layer 20 as shown in FIG. 6C. As shown in FIG. 6D, impurities such as Si are injected by injection energy of 5 keV to 10 keV, and a dose amount of $1.0E15$ cm$^{-2}$, and subjected to annealing at about 900° C. for several min. An amorphous Cu layer is fabricated in the vicinity of the surface of the Cu layer. Subsequently, SiN or the like is deposited by sputtering. Thus, an interconnection structure is obtained, where there is an amorphous Cu layer 23 in an interface between a cap SiN 17 and the Cu layer 16.

Next, description will be made of single and dual damascene structures, and a fabrication method thereof when the present invention is applied to the single damascene structure having a multilayer interconnection including at least one of such interconnections, for example the above-described interconnection structure of each layer, or the dual damascene structure having the above-described interconnection structure over two layers, for example a via hole and its upper layer interconnection.

First, the case where the invention is applied to the single damascene structure is described. FIGS. 7A to 7E are sectional views showing a fabrication process of a copper interconnection according to a sixth embodiment of the present invention.

According to the fabrication method of the multiplayer interconnection of the sixth embodiment of the invention where the copper interconnection fabrication method of the embodiment is applied to the single damascene structure, as shown in FIG. 7A, after a Cu interconnection groove 10 is fabricated, a barrier metal layer 12 mainly made of high melting point metal such as Ta is sputtered. Subsequently, impurities such as Nb 13 are injected by injection energy of 2 keV to 5 keV, and a dose amount of $1.0E14$ cm$^{-2}$, and subjected to annealing at about 350° C. for several min.

As shown in FIG. 7B, the impurity Nb becomes a solid solution on a very surface of the Ta layer 12. A seed Cu layer 14 is thinly sputtered, and then a Cu layer 16 is fabricated thick by a method such as electro-plating. This layer is subjected to heat treatment at about 250 to 350° C. for 5 min. to several hours in accordance with an interconnection thickness and/or an interconnection width to grow Cu grains, and uniformly fill the groove.

Subsequently, by using CMP method or the like, an interconnection 16a is fabricated as shown in FIG. 7C. A surface of the interconnection is treated such as cleaning and/or plasma irradiation to remove a Cu natural oxide layer and, then, an SiC layer 17 or the like is fabricated by sputtering. Thus, an interconnection structure is obtained, where an impurity Nb 15 becomes a solid solution in an interface between the seed Cu layer 14 and the Ta layer 12, and this interconnection is set as a lower layer interconnection.

Then, allow dielectric constant film 11a as an interlayer insulating film, and an SiCN layer 17a are fabricated thin. A via hole 71 is fabricated by a normal etching method, and treated such as ashing and/or cleaning. For this via hole 71, as in the case of the interconnection groove, sputtering of a barrier metal layer 12a of Ta or the like, injection of impurities 15a such as Nb and annealing, and sputtering of a seed Cu layer 14b, and electro-plating and annealing of a Cu layer 16a are executed.

Subsequently, CMP is executed to fabricate a via hole constituted of the barrier metal layer 12a of Ta or the like, the seed Cu layer 14b, the impurities 15a such as Nb, and the Cu layer 16. Then, as shown in FIG. 7D, an interlayer insulating film 11a is fabricated, and an upper layer interconnection is fabricated by a method similar to that of the lower layer interconnection and, accordingly as shown in FIG. 7E, a multilayer interconnection of a single damascene structure is fabricated.

The embodiment shows the structure where the impurity becomes a solid solution in the interface between the seed Cu layer and the Ta layer in all of the lower layer interconnection, the via hole, and the upper layer interconnection. However, a structure can also be fabricated, where the invention is applied to one of the lower layer interconnection, the via hole and the upper layer interconnection. Moreover, the number of interconnection layers is not limited to two, and the invention can be applied to a case of much more layers. The embodiment shows the case of the via hole made of Cu. However, other materials such as W may be used.

Next, description is made of a case of applying the copper interconnection fabrication method of the embodiment of the invention to a via first structure in a dual damascene structure. FIG. 8A to 8E are sectional views showing a copper interconnection fabrication process according to a seventh embodiment of the present invention.

According to the fabrication method of the multiplayer interconnection of the seventh embodiment of the invention where the copper interconnection fabrication method of the embodiment is applied to a via first structure in a dual damascene structure, as shown in FIG. 8A, after a Cu interconnection groove is fabricated, a barrier metal layer 12 mainly made of high melting point metal such as Ta, and a seed Cu layer 14 are thinly sputtered. Subsequently, impurities such as Ta are injected by injection energy of 5 keV, and a dose amount of $1.0E15$ cm$^{-2}$, and subjected to annealing at about 400° C. for several min. As shown in FIG. 8B, Cu in the vicinity of an interface between the seed layer Cu 14 and the Ta barrier metal layer 12 become amorphous.

Subsequently, a Cu layer 16a is fabricated thick by a method such as electro-plating. This layer is subjected to heat treatment at about 380° C. for 10 min. to several hours in accordance with an interconnection thickness and/or an interconnection width to grow Cu grains, and uniformly fill the groove. Subsequently, by using CMP method or the like, an interconnection is fabricated.

Further, as shown in FIG. 8C, a surface of the interconnection is treated such as cleaning and/or plasma irradiation to remove a Cu natural oxide layer and, then, an SiC layer 17 or the like is fabricated by sputtering. Thus, an interconnection structure is obtained, where there is an amorphous Cu layer 14a in the interface between the seed Cu layer and the Ta layer, and this interconnection is set as a lower layer interconnection.

Further, a low dielectric constant film 11a as an interlayer insulating film of a via hole part 81, and an SiCN layer 17a or the like are fabricated. Subsequently, a low dielectric constant film as an interlayer insulating film of an upper layer interconnection, and an SiO$_2$ film 11b are fabricated. Then, an anti-reflection compound (ARC) film, a photoresist and an etching mask ate fabricated and, by using gas containing fluorocarbon or the like, the via hole 81 is opened by etching.

Then, as shown in FIG. 8D, after treatment such as (wet) cleaning of the opening, a film prevented from a reflection, a photoresist, and an etching mask are deposited to fabricate an upper layer interconnection groove 82. As shown in FIG. 8E, after normal treatment such as wet cleaning and/or cleaning, as in the case of the lower layer interconnection, sputtering of a barrier metal layer 12c mainly made of high melting point metal such as Ta, and a seed Cu layer 14d are executed, impurities such as Ta 13c are injected by injection energy of 5 keV, and a dose amount of $1.0E15$ cm$^{-2}$, and subjected to annealing, and Cu in the vicinity of an interface between the seed Cu layer and the Ta barrier layer becomes amorphous.

Subsequently, a Cu layer 16d is fabricated thick by a method such as electroplating. This layer is subjected to heat treatment at about 350° C. for 10 min. to several hours in accordance with an interconnection thickness and/or an interconnection width to grow Cu grains, and uniformly fill the groove.

Subsequently, by using CMP method or the like, an interconnection is fabricated. A surface of the interconnection is treated such as cleaning and/or plasma irradiation to remove a Cu natural oxide layer and, then, an SiN layer 17 or the like is fabricated by sputtering. Thus, a laminated structure can be fabricated, where there is an amorphous Cu layer 14f in an interface between the seed Cu layer and the Ta layer, and this interconnection is set as a lower layer interconnection.

The embodiment shows the structure where the amorphous Cu layer 14f is present in the interface between the seed Cu layer and the Ta layer in both of the lower layer interconnection/the via hole and the upper layer interconnection. However, a structure can also be fabricated, where the invention is applied to one of the lower layer interconnection/the via hole and the upper layer interconnection. Moreover, the number of interconnection layers is not limited to two, and the invention can be applied to a case of much more layers.

Next, as a dual damascene fabrication method, in addition to the method for opening the via hole shown in the copper interconnection fabrication method of the seventh embodiment of the invention, and then fabricating the interconnection groove for the upper layer interconnection (via first), an example of a method for first fabricating an interconnection groove, and then a via hole (trench first) will be described as a copper interconnection fabrication method of an eight embodiment of the present invention.

That is, description is made of a case where the invention is applied to a trench first structure in a dual damascene structure. FIG. 9A to 9E are sectional views showing a copper interconnection fabrication process according to an eighth embodiment of the present invention.

According to the fabrication method of the multiplayer interconnection of the eighth embodiment of the invention where the copper interconnection fabrication method of the embodiment is applied to a via first structure in a dual damascene structure, as shown in FIG. 9A, after a Cu interconnection groove is fabricated, a barrier metal layer 12 mainly made of high melting point metal such as Ta, and a seed Cu layer 14 are thinly sputtered.

Subsequently, a solid phase containing impurities such as Si (18) are deposited, and subjected to annealing at about 400° C. for several min., to fabricate a Cu—Si compound 18a in an interface between the seed layer Cu 14 and the Ta barrier metal layer 12 as shown in FIG. 9B. Subsequently, a Cu layer 16a is fabricated thick by a method such as electroplating. This layer is subjected to heat treatment at about 350 to 400° C. for 10 min. to several hours in accordance with an interconnection thickness and/or an interconnection width to grow Cu grains, and uniformly fill the groove.

Subsequently, as shown in FIG. 9C, by using CMP method or the like, an interconnection is fabricated. A surface of the interconnection is treated such as cleaning and/or plasma irradiation to remove a Cu natural oxide layer and, then, an SiN layer 17 or the like is fabricated by sputtering. Thus, an interconnection structure is obtained, where there is a Cu—Si compound 18a in the interface between the seed Cu layer and the Ta layer, and this interconnection is set as a lower layer interconnection.

A low dielectric constant film 11c as an interlayer insulating film of a via hole part, and an SiCN layer 17d or the like are fabricated. Subsequently, a low dielectric constant film as an interlayer insulating film of an upper layer interconnection, and an $SiO_2$ film 11d are fabricated. Then, a reflection prevention film, a photoresist and an etching mask are fabricated and, by using gas containing fluorocarbon or the like, an upper layer interconnection groove 91 is opened by etching.

Then, as shown in FIG. 9D, after removal of the etching mask, a reflection prevention film for via hole opening, a photoresist, and an etching mask are fabricated, and etched to fabricate a via hole 92.

After normal treatment such as wet cleaning and/or cleaning, as in the case of the lower layer interconnection, sputtering of a barrier metal layer 12d mainly made of high melting point metal such as Ta, and a seed Cu layer 14g are executed, impurities such as Ta 12d are injected (injection energy of 5 keV, and a dose amount of $1.0E15\ cm^{-2}$), and subjected to annealing, and Cu 18b, 18c in the vicinity of an interface between the seed Cu layer and the Ta barrier layer becomes amorphous.

Subsequently, as shown in FIG. 9E, a Cu layer 16e is fabricated thick by a method such as electro-plating. This layer is subjected to heat treatment at about 380° C. for 10 min. to several hours in accordance with an interconnection thickness and/or an interconnection width to grow Cu grains, and uniformly fill the groove. Subsequently, by using CMP method or the like, an interconnection is fabricated. A surface of the interconnection is treated such as cleaning and/or plasma irradiation to remove a Cu natural oxide layer and, then, an SiN layer 17f or the like is fabricated by sputtering. Thus, an interconnection structure can be fabricated, where there is a seed Cu layer 14g in an interface between the seed Cu layer and the Ta layer, and this interconnection is set as an upper layer interconnection.

The embodiment shows the interconnection structure where the amorphous Cu layer is present in the interface between the seed Cu layer and the Ta layer in the lower layer interconnection, and the Cu—Si compound is present in the interface between the seed Cu layer and the Ta layer in the via hole and the upper layer interconnection. However, application can be made to various combinations, e.g., a case where structures are similar between the lower layer interconnection/the via hole and the upper layer interconnection, a case where in one of the structures, one of the copper interconnection fabrication methods of the first to fifth embodiments of the invention is employed, and other cases. Moreover, the number of interconnection layers is not limited to two, and the invention can be applied to a case of much more layers.

In the diffusion mechanism of the EM, there are lattice diffusion, grain boundary diffusion, interface diffusion, and the like depending on a main diffusion path. It is known that the diffusion is carried out via holes in many cases. In such a case, hole generation occurs at a first stage, holes are exchanged (accordingly material movement) at a second stage, and it is said that substantially equal amounts of activation energy are needed for both. Thus, in both grain boundary diffusion and interface diffusion executed through a grain boundary or an interface where there are many holes, activation energy is lower than lattice diffusion becase of lack of hole-generation activation energy to make diffusion faster.

For an EM suppression in the Al interconnection, as described in Patent Document 1, there is an example of adding a small amount of impurities such as Cu to Al. This is employed because as described in Nonpatent Document 1, impurities are deposited in an Al grain boundary to lower a hole density, whereby contribution of grain boundary diffusion is reduced. In the Cu interconnection, an dominant EM diffusion path is considered to be an interface with other materials. Thus, interface holes may be selectively removed.

As impurities to be added to Cu, many are possible. In addition to those deposited in the interface, as an example, Nb or Ta which fully fabricates a solid solution with Cu is suitable. For example, in the Cu and Nb system, a Cu—Nb compound is continuously present in an interface between Cu and Nb to greatly reduce holes. Compared with the case where impurities are deposited, this example is also advantageous in that there no resistance increases by impurities. V belonging to the same group as Nb may also be suitable.

Recently, a Cu—Si compound has been considered to contribute to an EM improvement. Thus, a method of implanting Si ions by good controllability, or the like is also preferable. In addition, Ru which causes an oxide to exhibit good conductivity is also preferable from the standpoint of removing CuOx from the interface and maintaining conductivity as RuOx.

Further, from the standpoint of making an interface structure continuous, it may be effective to make Cu amorphous to remove holes. Accordingly, ion implantation conditions of impurities may be conditions for making the vicinity of a very surface of Cu amorphous. An advantage accompanying the amorphous vicinity of the Cu interface is an improvement in physical properties such as adhesiveness and mechanical strength made by elimination of stress imbalance or local concentration to a passivation film such as a cap layer caused by a difference in growth rate according to criystal orientation during Cu crystal growth which occurs even at a room temperature. Moreover, the Cu amorphous treatment executed before the above-described CuSix treatment provides many effects such as uniform generation of CuSix.

As apparent from the foregoing, the present invention is effective in that when an interconnection width is narrower than an average Cu grain size, and a grain boundary becomes a bamboo structure, a bamboo effect for increasing a lifetime appears, and thus a lifetime is increased by about two digits compared with the Al interconnection.

A reason is that if there are impurities deposited in a gap in the vicinity of the interface between Cu and barrier metal (or cap), or if there is amorphous Cu in the interface between Cu and barrier metal (or cap), the number of holes, many being present in the interface between normal different materials, is reduced, and thus interface diffusion occurring through the holes can be suppressed. Accordingly, as Cu diffusion path by the EM, interface contribution is reduced, whereby a main Cu diffusion mechanism becomes lattice diffusion.

The impurities are not only precipitated in the interface, but may fabricate a compound in the interface. For example, it is known that Ta, Nb or the like fully fabricates a solid solution with Cu. Presence of such a compound may reduce holes in the interface to increase an EM lifetime. There is a report that silicide treatment of the Cu surface increases an EM lifetime, and its combination with the present invention can expectedly increase the lifetime more.

Use in the multilayer interconnection provides large resistance to stress migration caused by heat treatment executed for fabrication of each layer. In the single damascene structure, selection of a material of a melting point higher than that of Cu for a via hole enables fabrication of an interconnection structure of high interconnection reliability. In the dual damascene structure, since via adhesiveness can be enhanced, contribution can be made to a reduction in an initial failure rate, and Cu aggregation in the via which is one of failure modes can be suppressed.

I claim:

1. A copper interconnection comprising:
    a barrier metal layer fabricated on an interconnection groove;
    a Cu or Cu alloy layer fabricated over said barrier metal layer;
    an insulating cap layer covering said Cu or Cu alloy layer; and
    an amorphous Cu layer doped with impurities and intervening between said Cu or Cu alloy layer and said insulating cap layer, wherein said impurity is Ta.

* * * * *